(12) United States Patent
Katsuno et al.

(10) Patent No.: US 9,293,657 B2
(45) Date of Patent: Mar. 22, 2016

(54) SEMICONDUCTOR LIGHT EMITTING DEVICE

(71) Applicant: Kabushiki Kaisha Toshiba, Tokyo (JP)

(72) Inventors: Hiroshi Katsuno, Tokyo (JP); Satoshi Mitsugi, Kanagawa-ken (JP); Toshihide Ito, Tokyo (JP); Shinya Nunoue, Chiba-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/702,949

(22) Filed: May 4, 2015

(65) Prior Publication Data

US 2015/0236211 A1   Aug. 20, 2015

Related U.S. Application Data

(60) Division of application No. 14/470,024, filed on Aug. 27, 2014, which is a continuation of application No. 13/729,563, filed on Dec. 28, 2012, now Pat. No. 8,847,271.

(30) Foreign Application Priority Data

Aug. 21, 2012   (JP) .................................. 2012-182748

(51) Int. Cl.
*H01L 33/38* (2010.01)
*H01L 29/20* (2006.01)
(Continued)

(52) U.S. Cl.
CPC ............... *H01L 33/42* (2013.01); *H01L 33/32* (2013.01); *H01L 33/38* (2013.01)

(58) Field of Classification Search
CPC .................. H01L 29/2009; H01L 2924/0002; H01L 2924/00; H01L 33/20; H01L 33/22; H01L 33/38; H01L 33/44; H01L 33/62

USPC ........................................ 257/91, 99, E33.065
See application file for complete search history.

(56) References Cited

U.S. PATENT DOCUMENTS 8,334,153 B2 * 12/2012 Gotoda et al. .................. 438/29
2010/0078656 A1 * 4/2010 Seo et al. ........................ 257/88
(Continued)

FOREIGN PATENT DOCUMENTS

JP   2006-210824         8/2006
JP   2010-87515 A        4/2010
(Continued)

OTHER PUBLICATIONS

Office Action issued Jun. 2, 2015 in Japanese Patent Application No. 2013-127968 (with English language translation).
(Continued)

*Primary Examiner* — Earl Taylor
(74) *Attorney, Agent, or Firm* — Oblon, McClelland, Maier & Neustadt, L.L.P.

(57) ABSTRACT

According to one embodiment, a semiconductor light emitting device includes a first semiconductor layer, a second semiconductor layer, a light emitting layer, a dielectric layer, a first electrode, a second electrode and a support substrate. The first layer has a first and second surface. The second layer is provided on a side of the second surface of the first layer. The emitting layer is provided between the first and the second layer. The dielectric layer contacts the second surface and has a refractive index lower than that of the first layer. The first electrode includes a first and second portion. The first portion contacts the second surface and provided adjacent to the dielectric layer. The second portion contacts with an opposite side of the dielectric layer from the first semiconductor layer. The second electrode contacts with an opposite side of the second layer from the emitting layer.

18 Claims, 7 Drawing Sheets

(51) Int. Cl.
*H01L 33/62* (2010.01)
*H01L 33/42* (2010.01)
*H01L 33/32* (2010.01)

(56) References Cited

U.S. PATENT DOCUMENTS

| | | | |
|---|---|---|---|
| 2011/0220934 A1* | 9/2011 | Gotoda et al. | 257/98 |
| 2011/0220935 A1* | 9/2011 | Gotoda et al. | 257/98 |
| 2012/0235168 A1* | 9/2012 | Katsuno et al. | 257/88 |
| 2012/0292631 A1* | 11/2012 | Katsuno et al. | 257/76 |
| 2013/0153922 A1* | 6/2013 | Gotoda et al. | 257/76 |
| 2013/0234182 A1* | 9/2013 | Katsuno et al. | 257/98 |
| 2014/0054594 A1* | 2/2014 | Katsuno et al. | 257/76 |

FOREIGN PATENT DOCUMENTS

| | | |
|---|---|---|
| JP | 2010-141176 | 6/2010 |
| JP | 2011-258670 | 12/2011 |
| JP | 2012-129281 | 7/2012 |
| JP | 2012-243825 | 12/2012 |

OTHER PUBLICATIONS

Office Action issued Apr. 19, 2013, in Japanese Patent Application No. 2012-182748 (with English translation).

* cited by examiner

US 9,293,657 B2

SEMICONDUCTOR LIGHT EMITTING DEVICE

This application is a divisional of U.S. application Ser. No. 14/470,024 filed Aug. 27, 2014, which is a continuation of U.S. application Ser. No. 13/729,563 filed Dec. 28, 2012, which is incorporated herein by reference. This application also claims the benefit of JP 2012-182748 filed Aug. 21, 2012.

CROSS-REFERENCE TO RELATED APPLICATIONS

This application is based upon and claims the benefit of priority from the prior Japanese Patent Application No. 2012-182748, filed on Aug. 21, 2012; the entire contents of which are incorporated herein by reference.

FIELD

Embodiments described herein relate generally to a semiconductor light emitting device.

BACKGROUND

As a structure of a semiconductor light emitting device such as an LED (light emitting diode), there is a structure in which, for example, a crystal layer formed on a substrate is joined to a conductive substrate and then the substrate is removed. In this structure, the light extraction efficiency can be increased by performing roughening processing on the surface of the crystal layer exposed by removing the substrate. There is also a structure in which no electrode is formed on the surface of a crystal layer serving as a light extraction surface and a p-side electrode and an n-side electrode are formed on the crystal surface on the opposite side to the surface from which a substrate has been removed. In such semiconductor light emitting devices, further improvement in the light extraction efficiency is required.

DETAILED DESCRIPTION

Figure 1A:
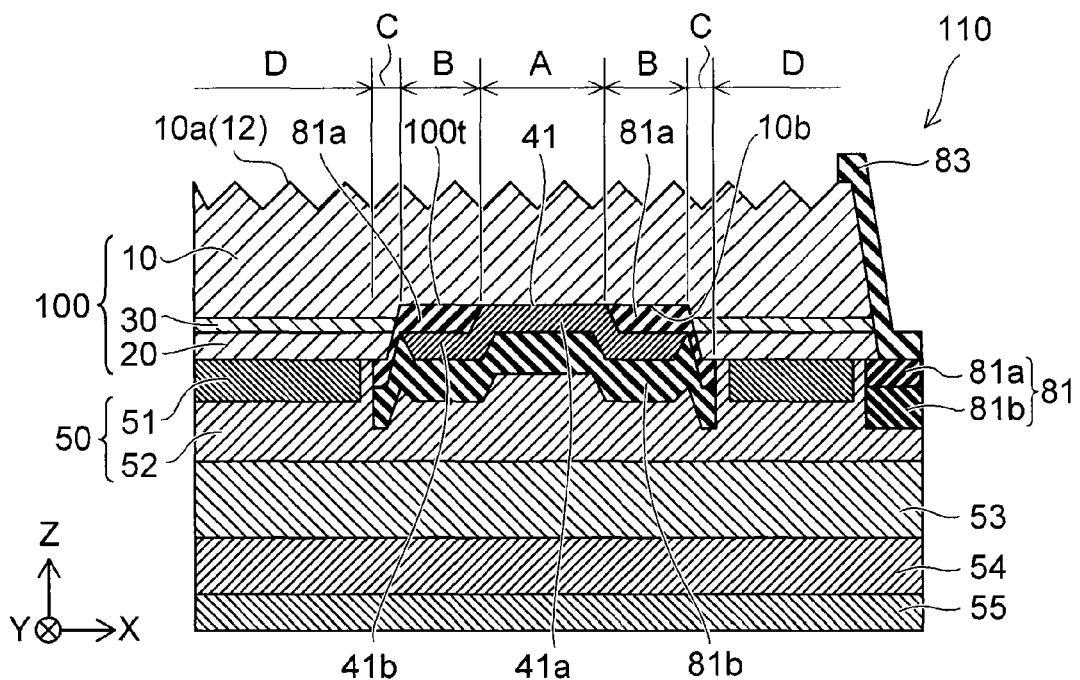
FIGS. 1A and 1B are schematic views showing a semiconductor light emitting device of a first embodiment.

In general, according to one embodiment, a semiconductor light emitting device includes a first semiconductor layer of a first conductivity type, a second semiconductor layer of a second conductivity type, a light emitting layer, a dielectric layer, a first electrode, a second electrode and a support substrate. The first semiconductor layer has a first surface and a second surface on an opposite side to the first surface. The second semiconductor layer is provided on a side of the second surface of the first semiconductor layer. The light emitting layer is provided between the first semiconductor layer and the second semiconductor layer. The dielectric layer contacts with the second surface and has a refractive index lower than a refractive index of the first semiconductor layer. The first electrode includes a first portion and a second portion. The first portion contacts with the second surface. The first portion is provided adjacent to the dielectric layer. The first portion has a first length in a first direction along the second surface. The first portion has a second length in a second direction perpendicular to the first direction. The second portion contacts with an opposite side of the dielectric layer from the first semiconductor layer. The second electrode has a portion. The portion contacts with an opposite side of the second semiconductor layer from the light emitting layer. The portion has a third length in the second direction. The support substrate is provided on an opposite side of the second electrode from the second semiconductor layer. The support substrate is electrically connected to the second electrode.

Various embodiments will be described hereinafter with reference of the accompanying drawings.

The drawings are schematic or conceptual; and the relationships between the thickness and length of portions, the proportional coefficients of sizes among portions, etc. are not necessarily the same as the actual values thereof. Further, the dimensions and proportional coefficients may be illustrated differently among drawings, even for identical portions.

In the specification of this application and the drawings, components similar to those described in regard to a drawing thereinabove are marked with the same reference numerals, and a detailed description is omitted as appropriate.

First Embodiment

Figure 1B:
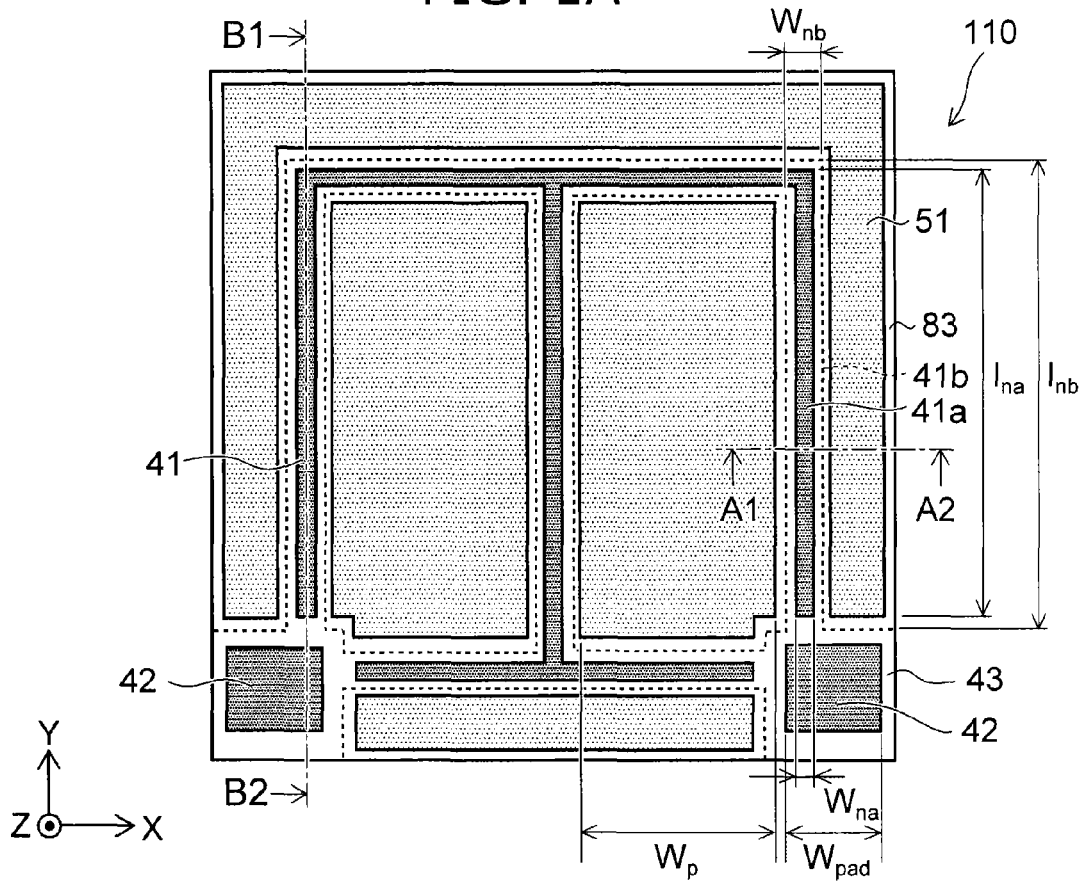

FIGS. 1A and 1B are schematic views showing a semiconductor light emitting device of a first embodiment.

Figure 2:
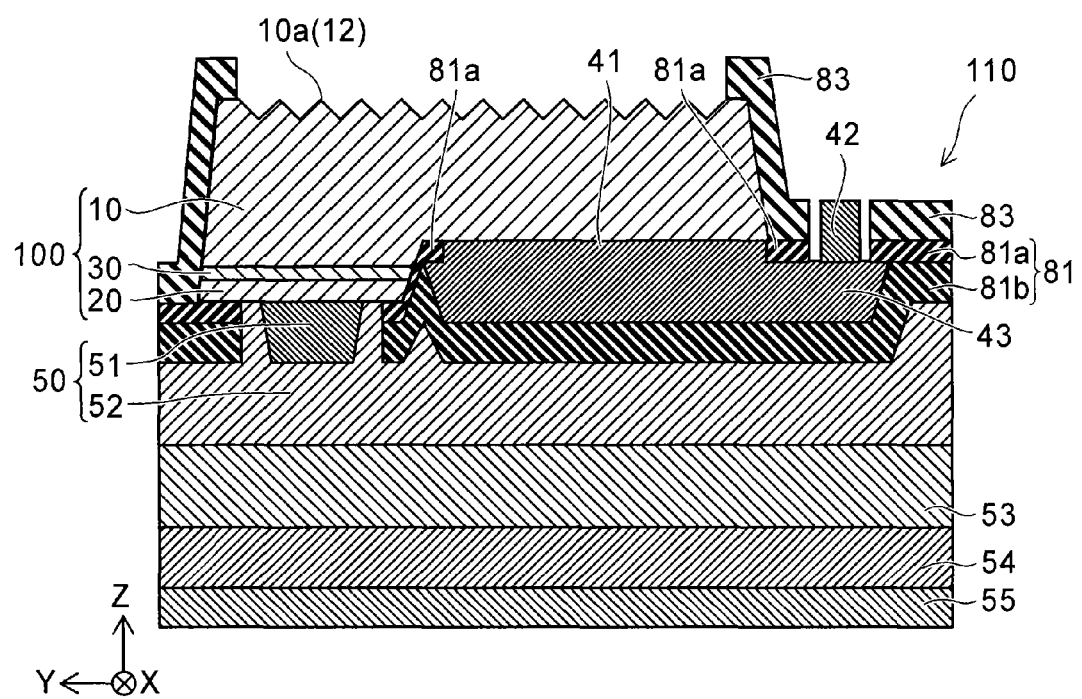
FIG. 2 is a schematic cross-sectional view showing the semiconductor light emitting device of the first embodiment.

FIG. 2 is a schematic cross-sectional view showing the semiconductor light emitting device of the first embodiment.

FIG. 1A is a schematic cross-sectional view taken in the direction of arrows A1-A2 of FIG. 1B, and FIG. 1B is a schematic plan view. FIG. 1B is a plan view as viewed from a plane along a stacked structure body described later.

FIG. 2 is a schematic cross-sectional view taken in the direction of arrows B1-B2 of FIG. 1B.

As shown in FIG. 1A, a semiconductor light emitting device 110 according to the first embodiment includes a first semiconductor 10, a second semiconductor 20, a light emitting layer 30, a dielectric layer 81, a first electrode 41, a second electrode 50, and a support substrate 54.

A stacked structure body 100 includes a first semiconductor layer 10 of a first conductivity type, a second semiconductor layer 20 of a second conductivity type, and the light emitting layer 30. In the stacked structure body 100, for example, the first semiconductor layer 10, the light emitting layer 30, and the second semiconductor layer 20 are formed in this order on a substrate for growth (not shown). The substrate for growth is removed after the stacked structure body 100 is formed. The first semiconductor layer 10 has a first surface 10a and a second surface 10b on the opposite side to the first surface 10a. The second semiconductor layer 20 is provided on the second surface 10b side of the first semiconductor layer 10. The light emitting layer 30 is provided between the first semiconductor layer 10 and the second semiconductor layer 20.

In the embodiment, the direction from the second semiconductor layer 20 toward the first semiconductor layer 10 is defined as the Z direction. One of the directions orthogonal to the Z direction is defined as the X direction, and the direction orthogonal to the Z direction and the X direction is defined as the Y direction.

The first conductivity type is the n type and the second conductivity type is the p type, for example. The first conductivity type may be the p type and the second conductivity type may be the n type. In the embodiment, the case where the first conductivity type is the n type and the second conductivity type is the p type is described as an example.

Each of the first semiconductor layer 10, the second semiconductor layer 20, and the light emitting layer 30 contains a nitride semiconductor. The first semiconductor layer 10, the second semiconductor layer 20, and the light emitting layer 30 contain, for example, $Al_xGa_{1-x-y}In_yN$ ($x \geq 0$, $y \geq 0$, $x+y \leq 1$).

The first semiconductor layer 10 includes, for example, a Si-doped n-type GaN contact layer and a Si-doped n-type AlGaN cladding layer in this order from the first surface 10a side. The first semiconductor layer 10 may further include a GaN buffer layer on the first surface 10a side of the Si-doped n-type GaN contact layer. The first surface 10a is a surface from which the light emitted from the light emitting layer 30 is mainly emitted to the outside.

The light emitting layer 30 has, for example, a multi-quantum well structure (MQW) in which a Si-doped n-type AlGaN barrier layer and an InGaN well layer are alternately stacked with N periods. N is an integer of 2 or more. For example, the light emitting layer 30 has MQWs in which a Si-doped n-type $Al_{0.11}Ga_{0.89}N$ barrier layer and an InGaN well layer are alternately stacked with six periods. In the Si-doped n-type $Al_{0.11}Ga_{0.89}N$ barrier layer, for example, the Si concentration is not less than $1.1 \times 10^{19}$ cm$^{-3}$ and not more than $1.5 \times 10^{19}$ cm$^{-3}$. The thickness of the MQWs of the light emitting layer 30 is, for example, 0.075 μm.

The last $Al_{0.11}Ga_{0.89}N$ barrier layer is provided on the second semiconductor layer 20 side in the MQWs. In the last $Al_{0.11}Ga_{0.89}N$ barrier layer, the Si concentration is, for example, not less than $1.1 \times 10^{19}$ cm$^{-3}$ and not more than $1.5 \times 10^{19}$ cm$^{-3}$, and the thickness is, for example, 0.01 micrometers (μm).

An $Al_{0.11}Ga_{0.89}N$ barrier layer may be further provided on the second semiconductor layer 20 side of the last $Al_{0.11}Ga_{0.89}N$ barrier layer in the MQWs. The wavelength of the emitted light in the light emitting layer 30 is, for example, not less than 370 nanometers (nm) and not more than 480 nm, or not less than 370 nm and not more than 400 nm.

The second semiconductor layer 20 includes a non-doped AlGaN spacer layer, a Mg-doped p-type AlGaN cladding layer, a Mg-doped p-type GaN contact layer, and a high-concentration Mg-doped p-type GaN contact layer in this order from the side in contact with the light emitting layer 30. Specifically, the second semiconductor layer 20 includes a non-doped $Al_{0.11}Ga_{0.89}N$ spacer layer (the thickness being, for example, 0.02 μm), a Mg-doped p-type $Al_{0.28}Ga_{0.72}N$ cladding layer (the Mg concentration being, for example, $1 \times 10^{19}$ cm$^{-3}$ and the thickness being, for example, 0.02 μm), a Mg-doped p-type GaN contact layer (the Mg concentration being, for example, $1 \times 10^{19}$ cm$^{-3}$ and the thickness being, for example, 0.4 μm), and a high-concentration Mg-doped p-type GaN contact layer (the Mg concentration being, for example, $5 \times 10^{19}$ cm$^{-3}$ and the thickness being, for example, 0.02 μm).

The compositions, composition ratios, types of the impurity, impurity concentrations, and thicknesses mentioned above are only examples and may be variously modified.

The dielectric layer 81 is in contact with part of the second surface 10b of the first semiconductor layer 10. A recess 100t is provided in the stacked structure body 100. The light emitting layer 30 and the second semiconductor layer 20 are divided by the recess 100t. The dielectric layer 81 is in contact with the first semiconductor layer 10 in the recess 100t.

The refractive index of the dielectric layer 81 is lower than the refractive index of the first semiconductor layer 10. By the refractive index difference between the dielectric layer 81 and the first semiconductor layer 10, the reflectance in the direction from the first semiconductor layer 10 toward the dielectric layer 81 is improved.

Here, part of the light emitted from the light emitting layer 30 is reflected at the first surface 10a of the first semiconductor layer 10. Of the light reflected at the first surface 10a, light traveling toward a portion of the dielectric layer 81 in contact with a second portion 41b is totally reflected on the outside of the escape cone and is reflected or absorbed at the second portion 41b on the inside of the escape cone. The larger the refractive index difference between the dielectric layer 81 and the first semiconductor layer 10 is, the smaller the angle of the escape cone is. In the case where the angle of the escape cone is small, most of the light is totally reflected at the interface between the first semiconductor layer 10 and the dielectric layer 81. Therefore, the refractive index difference between the dielectric layer 81 and the first semiconductor layer 10 is preferably large.

Since the first semiconductor layer 10 contains a nitride semiconductor, the refractive index of the first semiconductor layer 10 for the wavelength of 450 nm is approximately higher than 2.2. Specifically, the refractive index of AlN is 2.2, the refractive index of GaN is 2.4, and the refractive index of InN is higher than 2.6. Therefore, the dielectric layer 81 contains, for example, silicon oxide ($SiO_2$), silicon nitride (SiN), or silicon oxynitride (SiON). The refractive indices of these materials are lower than the refractive index of the nitride semiconductor. For example, the refractive index of $SiO_2$ is 1.4 to 1.5. By the dielectric layer 81 containing these materials, the refractive index difference between the dielectric layer 81 and the first semiconductor layer 10 is increased. Thereby, the reflectance in the direction from the first semiconductor layer 10 toward the dielectric layer 81 is improved. Furthermore, these materials are easy to process by patterning etc. and are therefore particularly effective.

The dielectric layer 81 may include a first layer and a second layer that has a refractive index different from the refractive index of the first layer and is in contact with the first layer. The dielectric layer 81 may include the (2k+1)-th layer that has a refractive index equal to the refractive index of the first layer and is in contact with the 2k-th layer and the (2k+2)-th layer that has a refractive index equal to the refractive index of the second layer and is in contact with the (2k+1)-th layer, where k is an integer of 1 or more. At this time, the thickness of each layer is preferably ¼ of the wavelength of the light emitted from the light emitting layer 30. Thereby, a dielectric layer 81 having a high reflectance is formed. Furthermore, the light extraction efficiency is improved.

The dielectric layer 81 may not only be in contact with the first semiconductor layer 10 but also be provided on the side surface of the stacked structure body 100 and a portion of the second semiconductor layer 20 on the opposite side to the first semiconductor layer 10.

The first electrode 41 includes a first portion 41a and a second portion 41b. The first portion 41a is in contact with a region of the second surface 10b of the first semiconductor layer 10 not in contact with the dielectric layer 81. The first portion 41a is provided adjacent to the dielectric layer 81. The "region of the second surface 10b not in contact with the dielectric layer 81" is a first region A described later, and is an opening of the dielectric layer 81. The first electrode 41 is in contact with the first semiconductor layer 10 via the opening. Electrons, for example, are injected from the interface in contact with the first portion 41a of the first electrode 41 toward the first semiconductor layer 10.

The second portion 41b of the first electrode 41 is in contact with a portion of the dielectric layer 81 on the opposite side to the first semiconductor layer 10. In other words, the second portion 41b is provided on the support substrate 54 side of the dielectric layer 81. The second portion 41b of the first electrode 41 does not contribute to the injection of carriers, but functions as an auxiliary interconnection for reducing the resistance of the first electrode 41.

Here, the region where the first portion 41a of the first electrode 41 is in contact with the second surface 10b is defined as a "first region A." The region where the second portion 41b overlaps with the dielectric layer 81 as viewed from the Z direction is defined as a "second region B." The region from the end of the dielectric layer 81 to the end of the first electrode 41 as viewed from the Z direction is defined as a "third region C." The region where the second electrode 50 is in contact with the second semiconductor layer 20 as viewed from the Z direction is defined as a "fourth region D."

The first portion 41a of the first electrode 41 is provided on the opposite side of the second portion 41b from the second electrode 50 when projected onto a plane parallel to the second surface 10b. The second portion 41b is provided at least between the first portion 41a and a contact portion 51 of the second electrode 50 as viewed from the Z direction. The second region B is provided between the first region A and the fourth region D as viewed from the Z direction. The third region C is located between the second region B and the fourth region D. For example, the first portion 41a is provided at the center of the recess 100t, and the second portion 41b is provided on both sides of the first portion 41a.

Thus, the first portion 41a (the first region A) where the first electrode 41 is in contact is away from the fourth region D by at least the length of the second region B. Thereby, a current spreads in a certain range from the first electrode 41 toward the second electrode 50 via the second region B which overlaps with the second portion 41b as viewed from the Z direction. Thereby, light emission is obtained in a wide range.

The first electrode 41 is preferably in ohmic contact with the first semiconductor layer 10. In the case where the first electrode 41 is in contact with an n-type GaN contact layer, the material of at least a portion of the first electrode 41 on the side in contact with the second surface 10b contains titanium (Ti), an alloy of Ti and aluminum (Al), or a conductive transparent oxide (e.g. ITO). These materials have good ohmic properties to the first semiconductor layer 10 of the n type, and on the other hand these materials have a low light reflectance. In the case where such materials are used, for example, both an improvement in the light extraction efficiency and current spread are achieved by employing the arrangement in the above manner of the first electrode 41 and the dielectric layer 81.

The first electrode 41 is not limited to these materials but may be aluminum (Al), silver (Ag), gold (Au), or an alloy containing at least one of them having a high reflectance. The light extraction efficiency is improved by the increase in the reflectance of the first electrode 41. As described later in a second embodiment, the first electrode 41 may have a structure of two or more layers.

The dielectric layer 81 further includes a portion covering the first electrode 41 on the opposite side of the first electrode 41 from the first semiconductor layer 10. Thereby, the first electrode 41 is electrically cut off from the second electrode 50.

Here, the dielectric layer 81 includes a first dielectric portion 81a in contact with the first semiconductor layer 10 and a second dielectric portion 81b provided on the opposite side of the first electrode 41 from the first semiconductor layer 10. The portion from the first dielectric portion 81a to the second dielectric portion 81b is formed of the same material, for example. In this case, no interface may be formed between the first dielectric portion 81a and the second dielectric portion 81b. The second dielectric portion 81b may contain a different material from the first dielectric portion 81a. In this case, an interface may be formed between the first dielectric portion 81a and the second dielectric portion 81b.

The first dielectric portion 81a has a thickness of, for example, 400 nm. The second dielectric portion 81b has a thickness of, for example, 600 nm.

The second electrode 50 is in contact with a portion of the second semiconductor layer 20 on the opposite side to the light emitting layer 30.

Further, the second electrode 50 includes a contact portion 51 and a bonding metal portion 52. The contact portion 51 is in contact with the second semiconductor layer 20. The bonding metal portion 52 is provided on the opposite side of the contact portion 51 from the first semiconductor layer 10, and is in contact with the support substrate 54. The bonding metal portion 52 overlaps with the first electrode 41 as viewed from the Z direction.

The material of at least a portion of the second electrode 50 on the side in contact with the second semiconductor layer 20 contains Ag. Thereby, the reflectance at the interface between the second electrode 50 and the second semiconductor layer 20 is improved. The outward extraction efficiency of light in the semiconductor light emitting device 110 is improved.

Specifically, the contact portion 51 contains, for example, Ag. The contact portion 51 has a thickness of, for example, 200 nanometers (nm). The bonding metal portion 52 is, for example, a layer in which Ti/Pt/Au are stacked from the second semiconductor layer 20 side.

The support substrate 54 is provided on the opposite side of the second electrode 50 from the second semiconductor layer 20, and is electrically connected to the second electrode 50. A bonding layer 53 is provided between the support substrate 54 and the second electrode 50. A different material from the bonding metal portion 52 of the second electrode 50 is used for the bonding layer 53. Specifically, the bonding layer 53 contains a solder of a AuSn alloy.

The support substrate 54 overlaps with the first semiconductor layer 10 as viewed from the Z direction. The area of the support substrate 54 is at least not less than the area of the first semiconductor layer 10.

The support substrate 54 has electrical conductivity. Specifically, the support substrate 54 is, for example, a semiconductor substrate of Si or the like or a metal substrate of Cu, CuW, or the like. The support substrate 54 may be formed by plating. Thereby, the bonding layer 53 becomes unnecessary and manufacturing costs are reduced. Furthermore, the thermal history in the bonding process is eliminated and thermal degradation is suppressed.

A back surface electrode 55 is provided on the opposite side of the support substrate 54 from the second electrode 50.

The back surface electrode 55 is, for example, a layer in which Ti/Pt/Au are stacked from the support substrate 54 side. The back surface electrode 55 has a thickness of, for example, 800 nm.

As shown in FIG. 1B, the first portion 41a extends in a first direction (e.g. the Y direction) along the second surface 10b. The length $l_{na}$ in the first direction (the Y direction) of the first portion 41a is longer than the length $w_{na}$ in a second direction (the X direction) perpendicular to the first direction of the first portion 41a. The length $w_{na}$ is the fine line width of the first portion 41a. For example, the first electrode 41 is a fine line electrode having a shape longer in the first direction.

The length $w_{na}$ in the second direction (the X direction) of the first portion 41a is shorter than the length $w_p$ in the second direction (the X direction) of a portion of the second electrode 50 in contact with the second semiconductor layer 20, for example.

The area of the portion of the second electrode 50 in contact with the second semiconductor layer 20 is larger than the area of the first electrode 41. The "area of the portion of the second electrode 50 in contact with the second semiconductor layer 20" approximately corresponds to the area of the contact portion 51. The second electrode 50 is provided over the entire surface of the support substrate 54, for example. The area of the second electrode 50 (including the bonding metal portion 53) is almost equal to the area of the support substrate 54. On the other hand, the first electrode 41 is a fine line electrode as mentioned above. The first electrode 41 is not provided over the entire element surface.

Here, the resistivity of the second semiconductor layer 20 of the p type is higher than the resistivity of the first semiconductor layer 10 of the n type. Specifically, the resistivity of the second semiconductor layer 20 of the p type is, for example, not less than 100 times and not more than 1000 times the resistivity of the first semiconductor layer 10 of the n type. The spread of carriers in the first semiconductor layer 10 is longer than the spread of carriers in the second semiconductor layer 20. The current tends to spread in a certain range in the first semiconductor layer 10, and on the other hand tends to spread less easily in the second semiconductor layer 20.

By the first electrode 41 having a fine line shape, the portion where the second electrode 50 is in contact with the second semiconductor layer 20 can be enlarged. By such an arrangement, the light emitting region is expanded by the current spread in a limited element area.

As described above, the second electrode 50 is electrically connected to the support substrate 54. The support substrate 54 overlaps with the first electrode 41 as viewed from the Z direction. Therefore, by drawing out the first electrode 41 in a fine shape from a pad described later, the first electrode 41 does not interfere with the electrical connection between the second electrode 50 and the support substrate 54.

The second portion 41b is provided on both sides of the first portion 41a as viewed from the Z direction. The area of the second portion 41b is, for example, larger than the area of the first portion 41a. For example, the length $l_{nb}$ in the Y direction of the second portion 41b is longer than the length $l_{na}$ in the Y direction of the first portion 41a. Furthermore, for example, the length $w_{nb}$ in the X direction of the first electrode 41 is longer than the length $w_{na}$ in the X direction of the first portion 41a.

The first portion 41a of the first electrode 41 is a region that absorbs light easily. Hence, the first portion 41a is preferably limited to a range necessary to inject carriers. Specifically, the length $w_{na}$ of the first portion 41a of the first electrode 41 is, for example, not less than 5 μm and not more than 15 μm. The contact resistance decreases as the length $w_{na}$ of the first portion 41a increases. Thereby, the operating voltage of the semiconductor light emitting device 110 is reduced. However, since usually the contact resistance of the first portion 41a is lower than the contact resistance of the second electrode 50 and the first semiconductor layer 10 has a lower resistivity than the second semiconductor layer 20, the current inclines to the second electrode 50 side of the first portion 41a. Therefore, if the length $w_{na}$ in the X direction of the first portion 41a becomes a certain value or more, the decrease in the operating voltage levels off. The length $w_{na}$ in the X direction of the first portion 41a is determined with consideration of the current spread in the X direction.

On the other hand, the length $w_{nb}$ in the X direction of the first electrode 41 is, for example, 20 μm. Thereby, the resistance of the first electrode 41 is reduced. Furthermore, when it is desired to reduce the resistance of the first electrode 41, the length $W_{nb}$ may be made long, for example 50 μm. However, as the second portion 41b is made longer, since the area of the second electrode 50 is decreased, the light emitting region and the reflection region are decreased and the light output may be reduced. The length $W_{nb}$ may be determined with consideration of these.

As shown in FIG. 1B, the first electrode 41 includes an extension portion 43 provided up to the outside of the first semiconductor layer 10. The extension portion 43 is provided in an opening of the first semiconductor layer 10. A pad 42 is provided in the extension portion 43 as viewed from the Z direction. The pad 42 is in contact with the extension portion 43. Thereby, a current is supplied from the pad 42 to the first electrode 41. The pad 42 may be provided in plural, for example. The pad 42 is, for example, in a rectangular shape as viewed from the Z direction.

The first portion 41a is away from the pad 42 by a prescribed distance. Thereby, the possibility is reduced that the region of electron injection from the first portion 41a of the first electrode is concentrated on the pad 42 side of the first portion 41a.

The length $w_{pad}$ in the second direction (the X direction) of the pad 42 is longer than the length $w_{na}$ of the first portion 41a. For example, one side of the outer periphery of the pad 42 is longer than the length $w_{na}$ of the first portion 41a. Thereby, a bonding wire (not shown) is stably connected to the pad 42. Specifically, the length $w_{pad}$ of the pad 42 is, for example, 130 μm.

As shown in FIG. 2, by part of the stacked structure body 100 being removed, the extension portion 43 is exposed from the first semiconductor layer 10. The pad 42 is provided on the opposite side of the extension portion 43 from the support substrate 54. The second dielectric portion 81b of the dielectric layer 81 is in contact with the support substrate 54 side of the extension portion 43. The extension portion 43 overlaps with the support substrate 54 as viewed from the Z direction at least via the second dielectric portion 81b of the dielectric layer 81.

The substrate for growth (not shown) has been removed from the first surface 10a of the first semiconductor layer 10.

The first surface 10a of the first semiconductor layer 10 has a plurality of concavities-convexities 12. The length between adjacent convexities out of the concavities-convexities 12 is preferably not less than the peak wavelength in the first semiconductor layer 10 of the emitted light emitted from the light emitting layer 30. When the length between adjacent convexities out of the concavities-convexities 12 is smaller than the wavelength of the emitted light, the emitted light incident on the concavities-convexities 12 exhibits behavior explained by wave optics such as scattering and diffraction at the interface of the concavities-convexities 12. Consequently, part of the emitted light is not extracted due to the concavities-convexities 12. When the length between adjacent convexities out of the concavities-convexities 12 is sufficiently smaller than the wavelength of the emitted light, the portion where the concavities-convexities 12 are provided is regarded as a layer in which the refractive index changes continuously. Consequently, the first surface 10a is similar to a flat surface in which no concavities-convexities are formed. The effect of improving the light extraction efficiency by means of the concavities-convexities 12 is reduced.

The planar configuration of the concavities-convexities 12 of the first surface 10a is, for example, a hexagonal configuration. In this case, the length between adjacent convexities refers to the length between diagonally opposite vertices of the hexagon. The concavities-convexities 12 are formed by, for example, performing anisotropic etching on the first semiconductor layer 10 using a KOH solution. Thereby, the light emitted from the light emitting layer 30 is reflected in a Lambertian manner at the interface (the first surface 10a) between the first semiconductor layer 10 and the outside.

The concavities-convexities 12 may be formed also by dry etching using a mask. In this method, the concavities-convexities 12 are formed in accordance with the design. Therefore, the light extraction efficiency is easily improved.

The semiconductor light emitting device 110 may further include a dielectric layer 83 covering the side surface of the first semiconductor layer 10, the side surface of the light emitting layer 30, and the side surface of the second semiconductor layer 20. The dielectric layer 83 contains the same material as the dielectric layer 81, for example. Specifically, the dielectric layer 83 contains $SiO_2$. The dielectric layer 83 functions as a protection layer for the stacked structure body 100. Thereby, the degradation of the semiconductor light emitting device 110 and leakage are suppressed.

The semiconductor light emitting device 110 may further include a sealing unit (not shown) covering the stacked structure body 100. A resin, for example, is used for the sealing unit. The sealing unit may contain a fluorescent substance that emits light by being excited by the light emitted from the light emitting layer 30.

Next, characteristics of the semiconductor light emitting device 110 of the first embodiment are described with comparison to reference examples.

Figure 3A:
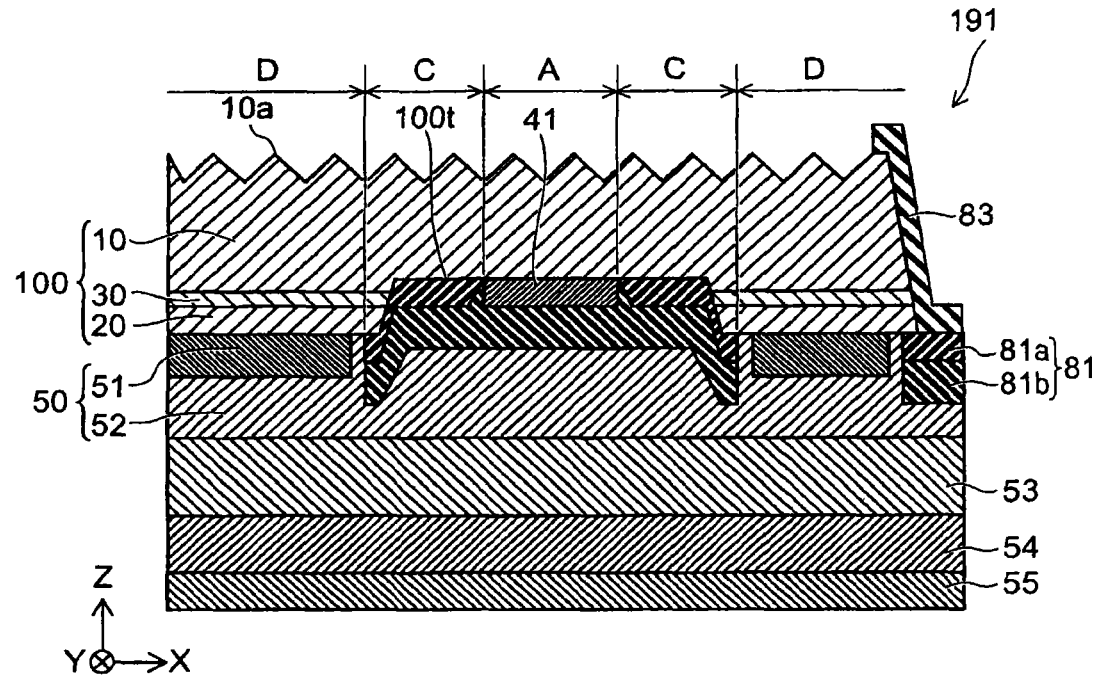
FIGS. 3A and 3B are schematic cross-sectional views showing semiconductor light emitting devices according to reference examples.
Figure 3B:
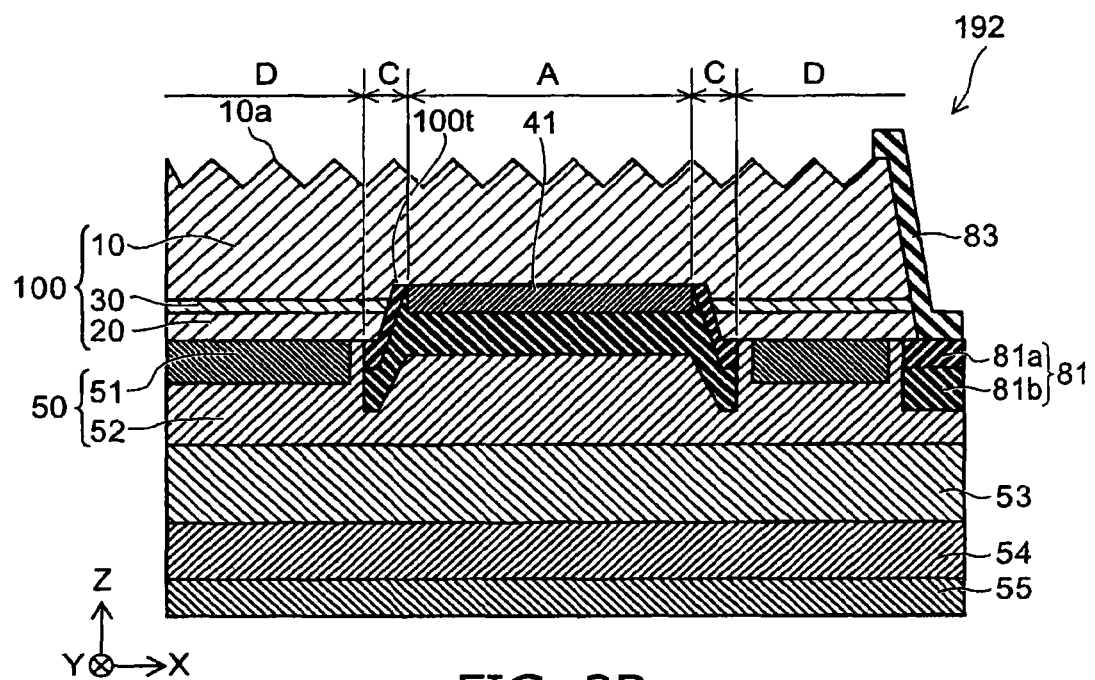

FIGS. 3A and 3B are schematic cross-sectional views showing semiconductor light emitting devices according to reference examples. FIG. 3A illustrates a semiconductor light emitting device 191 of a first reference example. FIG. 3B illustrates a semiconductor light emitting device 192 of a second reference example.

As shown in FIG. 3A, the first electrode 41 of the semiconductor light emitting device 191 according to the first reference example includes only the first portion 41a in the first embodiment. The second portion 41b is not provided on the support substrate 54 side of the dielectric layer 81. That is, in the second region B, only the dielectric layer 81 is provided and the first electrode 41 is not provided. The length in the X direction of the first electrode 41 in the first reference example is equal to the length ($w_{na}$) of the first portion 41a in the first embodiment.

As shown in FIG. 3B, also the first electrode 41 of the semiconductor light emitting device 192 according to the second reference example includes only the first portion 41a in the first embodiment. In the second reference example, the first electrode 41 is provided to near the side surface of the light emitting layer 30. The length in the X direction of the first electrode 41 in the second reference example is longer than the length in the X direction of the first portion 41a in the first reference example. The second region B in the second reference example is shorter than the second region B in the first embodiment.

The configuration of the other portions of the semiconductor light emitting device 191 of the first reference example and the semiconductor light emitting device 192 of the second reference example mentioned above is similar to that of the semiconductor light emitting device 110 of the first embodiment.

Figure 4A:
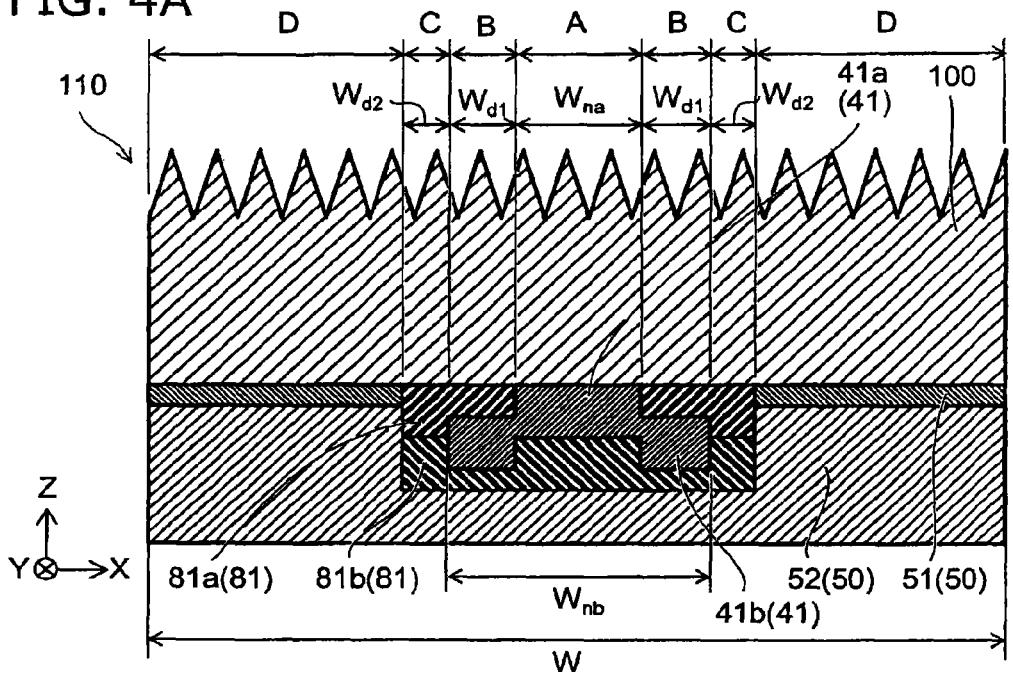
FIG. 4A and FIG. 4B are schematic cross-sectional views of two-dimensional models used in the rough calculations.
Figure 4B:
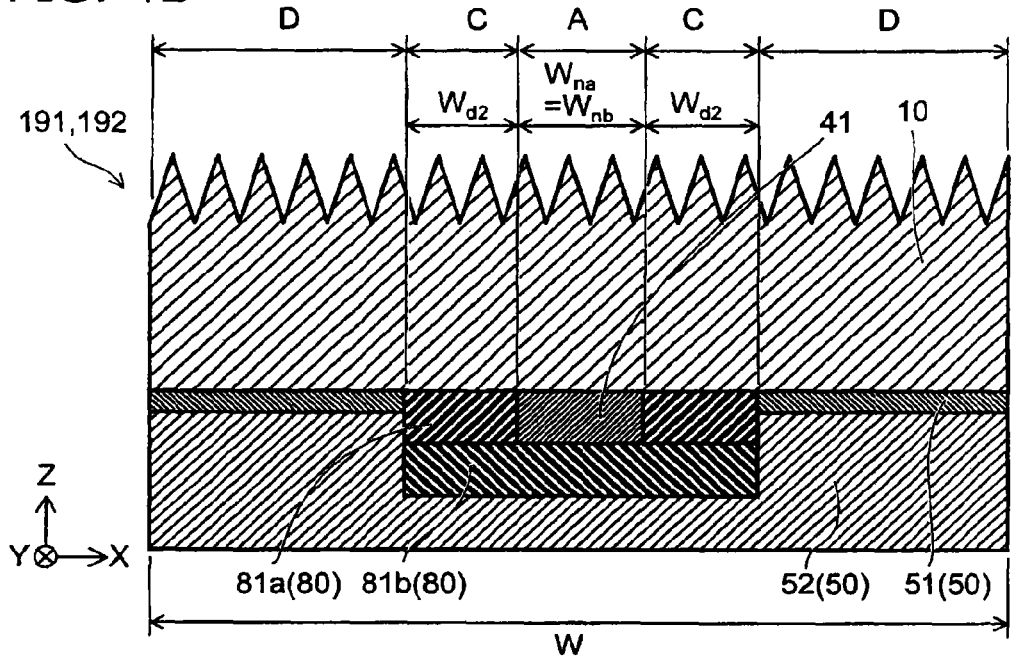

Here, the light extraction efficiency and the resistance of the first electrode 41 in the first embodiment, the first reference example, and the second reference example are described using FIGS. 4A and 4B. In each case, rough calculations were made under the following conditions.

FIG. 4A and FIG. 4B are schematic cross-sectional views of two-dimensional models used in the rough calculations.

Each of FIG. 4A and FIG. 4B shows a cross-sectional view in the XZ plane.

FIG. 4A is a schematic cross-sectional view of the semiconductor light emitting device 110 of the first embodiment.

FIG. 4B is a schematic cross-sectional view of the semiconductor light emitting device 191 of the first reference example and the semiconductor light emitting device 192 of the second reference example.

As shown in FIG. 4A and FIG. 4B, two-dimensional models of simplified semiconductor light emitting devices are considered. For simplification of the drawing, the light emitting layer 30 and the second semiconductor layer 20 are omitted. The case is considered where the first electrode 41 is provided on a straight line in the Y direction. "The resistance of the first electrode 41" is the resistance when a current is passed in the Y direction through the first electrode 41 extending in the Y direction of FIGS. 4A and 4B.

The conditions like below are assumed in all of the first embodiment, the first reference example, and the second reference example.

The light emitted from the light emitting layer 30 is extracted from the first surface 10a while being multiply reflected between the first surface 10a and the contact portion 51 of the second electrode 50. The light emitted from the light emitting layer 30 is reflected in a Lambertian manner at the first surface 10a. The first semiconductor layer 10 is covered with a silicone resin. In this case, the efficiency of light extraction from the first surface 10a of the first semiconductor layer 10 is 28%. That is, the reflectance of light at the first surface 10a is 72%. The absorptance of emitted light in the stacked structure body 100 is assumed to be 2% per round trip.

As described above, the first region A is the region where the first portion 41a of the first electrode 41 is in contact with the second surface 10b. The second region B is the region where the second portion 41b overlaps with the dielectric layer 81 as viewed from the Z direction. The third region C is the region from the end of the dielectric layer 81 to the end of the first electrode 41 as viewed from the Z direction. The fourth region D is the region where the second electrode 50 is in contact with the second semiconductor layer 20 as viewed from the Z direction.

The length in the X direction of the semiconductor light emitting device is denoted by W, and the length in the X direction of one region out of the second regions B provided on both sides of the first region A is denoted by $w_{d1}$. The length in the X direction of one region out of the third regions C provided on both sides of the first electrode 41 is denoted by $w_{d2}$. In the case of the first embodiment, the length of the first portion 41a (the length in the X direction of the first region A) is assumed to be $w_{na}$, and the length in the X direction of the first electrode 41 is assumed to be $w_{nb}$. That is, $w_{nb}=w_{na}+2w_{d1}$. It is assumed that the thickness of the first portion 41a and the thickness of the second portion 41b are the same.

On the other hand, as shown in FIG. 4B, in the cases of the first reference example and the second reference example, since the first electrode 41 does not include the second portion 41b, the length of the first electrode 41 is assumed to be $w_{na}$.

The reflectance of the first portion 41a of the first electrode 41 (the reflectance of the first region A) is denoted by $R_n$, the reflectance of the second region B is denoted by $R_{d1}$, the reflectance of the third region C is denoted by $R_{d2}$, and the reflectance of the contact portion 51 of the second electrode 50 (the reflectance of the fourth region D) is denoted by $R_p$. For simplification, the reflectance of the whole of each semiconductor light emitting device is denoted by $R_{total}$ and it is assumed that the reflectance $R_{total}$ is given by Formula (1) below as the average value weighted by the length in the X direction for the reflectance of each region.

$$R_{total}=w_{na}R_n/W+2w_{d1}R_{d1}/W+2W_{d2}R_{d2}/W+(W-2w_{d1}-2W_{d2}-w_{na})R_p/W \quad (1)$$

When the resistance of the first electrode 41 is denoted by r, the length in the Y direction of the first electrode 41 is denoted by $l_{na}$, the electric resistivity of the first electrode 41 is denoted by ρ, and the thickness of the first electrode 41 is denoted by t, r is given by Formula (2) below.

$$r=\rho l_{na}/(w_{nb}t) \quad (2)$$

Here, the reflectance $R_{total}$ and the resistance r of the first electrode 41 were roughly calculated using the following conditions.

The stacked structure body 100 is GaN, and the dielectric layer 81 is $SiO_2$. The material of the first electrode 41 is Ti/Au. The material of a portion of the first electrode 41 in contact with the stacked structure body 100 is Ti. The material of the contact portion 51 of the second electrode 50 is Ag.

In this case, the reflectance $R_p$ of the contact portion 51 of the second electrode 50 (the fourth region D) is 95.1%.

The reflectance $R_n$ of the first portion 41a of the first electrode 41 (the first region A) is 46.5%.

The reflectance at the interface between the stacked structure body 100 and the dielectric layer 81 is found in the following manner. The light that has entered the escape cone determined by the refractive index difference between the stacked structure body 100 and the dielectric layer 81 is reflected by Ti having a low reflectance. The other light is totally reflected at the interface between the stacked structure body 100 and the dielectric layer 81. Therefore, both of the reflectance $R_{d1}$ in the second region B and the reflectance $R_{d2}$ in the third region C are 91.6%.

In all of the semiconductor light emitting devices, the thickness (t) of the first electrode 41 is 0.7 μm, and Ti and Au form a stacked film in which Ti has a thickness of 0.1 μm and Au has a thickness of 0.6 μm. The length ($l_{na}$) in the Y direction of the first electrode 41 is 300 μm.

Other conditions in the semiconductor light emitting device 110 of the first embodiment are as follows:

The length W in the X direction of the semiconductor light emitting device 110 is 200 μm.

The length $w_{na}$ in the X direction of the first region A is 10 μm.

The length $w_{d1}$ in the X direction of one region out of the second regions B provided on both sides of the first region A is 5 μm. That is, the total length ($2w_{d1}$) in the X direction of the second regions B is 10 μm.

The length $w_{d2}$ in the X direction of one region out of the third regions C provided on both sides of the first electrode 41 is 5 μm. That is, the total length ($2w_{d2}$) in the X direction of the third regions C is 10 μm.

The length ($W-2w_{d1}-2W_{d2}-w_{na}$) in the X direction of the fourth region D is 170 μm.

Other conditions in the semiconductor light emitting device 191 of the first reference example are as follows:

The length W in the X direction of the semiconductor light emitting device 191 is equal to that of the semiconductor light emitting device 110, which is 200 μm.

The length $w_{na}$ in the X direction of the first region A is equal to that of the semiconductor light emitting device 110, which is 10 μm.

Since the second region B is not provided, the total length ($2w_{d1}$) in the X direction of the second regions B is 0 μm.

The total length ($2w_{d2}$) in the X direction of the third regions C is 20 μm.

The length ($W-2w_{d1}-2W_{d2}-w_{na}$) in the X direction of the fourth region D is 170 μm.

Other conditions in the semiconductor light emitting device 192 of the second reference example are as follows:

The length W in the X direction of the semiconductor light emitting device 192 is equal to that of the semiconductor light emitting device 110, which is 200 μm.

The length $w_{na}$ in the X direction of the first region A is 20 μm.

Since the second region B is not provided, the total length ($2w_{d1}$) in the X direction of the second regions B is 0 μm.

The total length ($2w_{d2}$) in the X direction of the third regions C is 10 μm.

The length ($W-2w_{d1}-2W_{d2}-w_{na}$) in the X direction of the fourth region D is 170 μm.

In the above conditions, the light extraction efficiency and the resistance of the first electrode 41 in each case are as follows:

The light extraction efficiency in the first reference example is 77.2%.

The resistance of the first electrode 41 in the first reference example is 1.24 Ω.

The light extraction efficiency in the second reference example is 73.0%.

The resistance of the first electrode 41 in the second reference example is 0.62 Ω.

The light extraction efficiency in the first embodiment is 77.2%.

The resistance of the first electrode 41 in the first embodiment is 0.62 Ω.

Thus, the light extraction efficiency in the first embodiment is higher than the light extraction efficiency in the second reference example by 4.2 points (5.8%). The resistance of the first electrode 41 in the first embodiment is ½ of the resistance of the first electrode 41 in the first reference example.

The results of the rough calculations mentioned above are presumed to be due to the operation and effect like below.

In the first reference example in FIG. 3A, the length $w_{na}$ of the first electrode 41 is equal to the length $w_{na}$ of the first electrode 41 in the first embodiment. The first electrode 41 does not include the second portion 41b, and is not provided on the support substrate 54 side of the dielectric layer 81. As described above, the reflectance of the first electrode 41 is lower than the reflectance at the interface between the first semiconductor layer 10 and the dielectric layer 81. In the first reference example, the area of the first electrode 41 that is a light absorption region is small. Thereby, the light extraction efficiency of the first reference example is higher than the light extraction efficiency of the second reference example.

However, the cross-sectional area of the first electrode 41 of the first reference example is smaller than that of the second reference example. Hence, the resistance of the first electrode 41 is high. In the first reference example, a current may spread less easily over the whole semiconductor light emitting device 191.

In the second reference example in FIG. 3B, the length $w_{na}$ of the first electrode 41 is equal to the length ($w_{nb}$) of the whole first electrode 41 in the first embodiment. The length $w_{na}$ of the first electrode 41 of the second reference example is longer than the length $w_{na}$ of the first electrode of the first reference example. The cross-sectional area of the first electrode 41 of the second reference example is larger than the cross-sectional area of the first electrode 41 of the first reference example. Thereby, the resistance of the first electrode 41 of the second reference example is lower than the resistance of the first electrode 41 of the first reference example.

However, in the second reference example, the area of the first electrode 41 that is a light absorption region is large. Hence, the light extraction efficiency is low in the second reference example.

In contrast, as shown in FIG. 1A, in the first embodiment, the first electrode 41 includes the first portion 41a in contact with a region of the first semiconductor layer 10 not in contact with the dielectric layer 81 and the second portion 41b in contact with a portion of the dielectric layer 81 on the opposite side to the first semiconductor layer 10. In the first embodiment, the first portion 41a is provided in a minimum range necessary as a carrier injection region. The second portion 41b is provided on the support substrate 54 side of the dielectric layer 81, and functions as an auxiliary interconnection. Thereby, the resistance of the first electrode 41 in the first embodiment is lower than the resistance of the first electrode 41 in the first reference example. In the first embodiment, since the resistance of the first electrode 41 is low, a current spreads over the whole semiconductor light emitting device 110.

In the first embodiment, the dielectric layer 81 is provided between the second portion 41b of the first electrode 41 and the first semiconductor layer 10. As described above, the dielectric layer 81 has a refractive index lower than the refractive index of the first semiconductor layer 10. By the refractive index difference between the dielectric layer 81 and the first semiconductor layer 10, the reflectance in the direction from the first semiconductor layer 10 toward the dielectric layer 81 is improved. In the second reference example, the area of the first electrode 41 is large, and the area of the dielectric layer 81 is small. Thus, the light extraction efficiency in the first embodiment is higher than the light extraction efficiency in the second reference example.

Figure 5A:
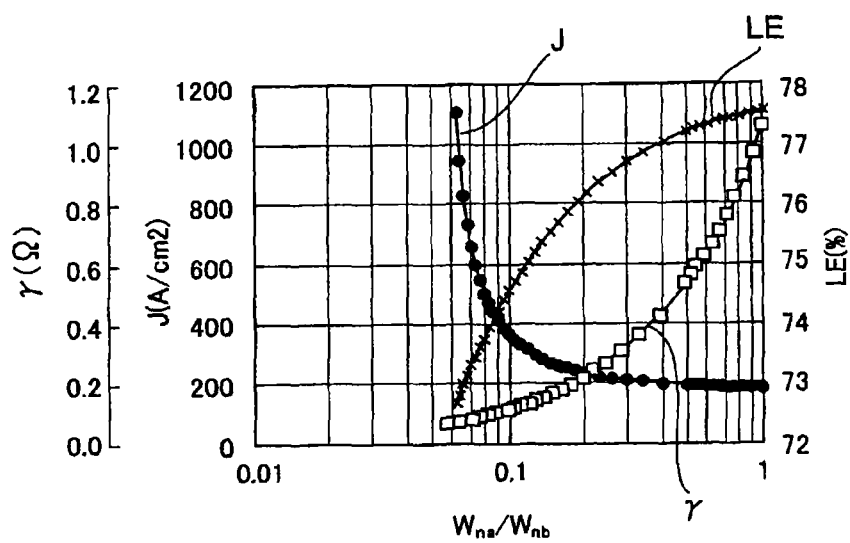
FIG. 5A and FIG. 5B are graphs showing characteristics obtained through the rough calculations of the semiconductor light emitting device according to the two-dimensional model of FIGS. 4A and 4B.
Figure 5B:
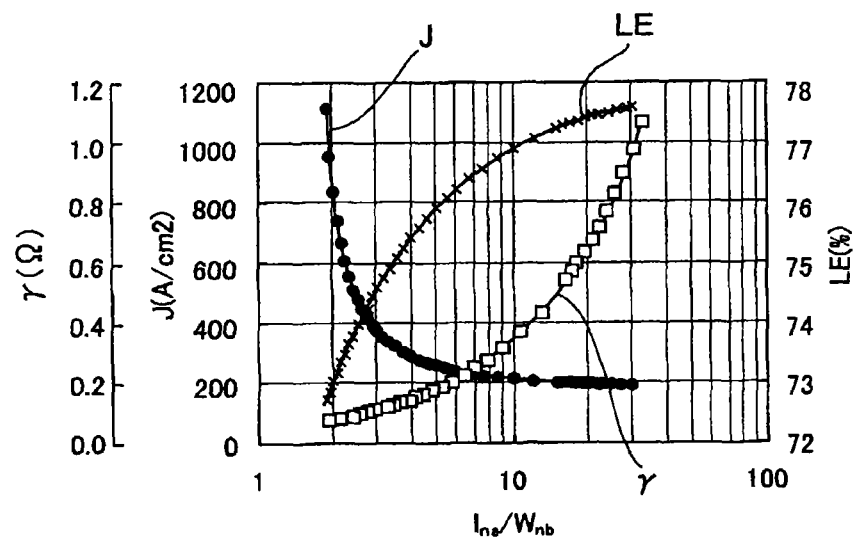

FIG. 5A and FIG. 5B are graphs showing characteristics obtained through the rough calculations of the semiconductor light emitting device according to the two-dimensional model of FIGS. 4A and 4B.

The horizontal axis of FIG. 5A is the ratio ($w_{na}/w_{nb}$) of the Length $w_{na}$ in the X direction of the first portion 41a to the length $w_{nb}$ in the X direction of the first electrode 41.

The vertical axis of FIG. 5A is the resistancer ($\Omega$) of the first electrode 41, the density J (A/cm$^3$) of current injected into the light emitting layer 30 of the semiconductor light emitting device 110, which is calculated from the area of the contact portion 51 of the second electrode 50 (the area of the fourth region D) when the operating current is 100 mA, or the light extraction efficiency LE (%) of the semiconductor light emitting device 110.

The horizontal axis of FIG. 5B is the ratio ($l_{na}/w_{nb}$) of the length $l_{na}$ in the Y direction of the first electrode 41 to the length $w_{nb}$ in the X direction of the first electrode 41.

The vertical axis of FIG. 5B is the same as the vertical axis of FIG. 5A.

The conditions in FIG. 5A and FIG. 5B are as follows:
The length ($l_{na}$) in the Y direction of the first electrode 41 is 300 µm.

The thickness (t) of the first electrode 41 is 0.7 µm, and Ti and Au form a stacked film in which Ti has a thickness of 0.1 µm and Au has a thickness of 0.6 µm.

The length W in the X direction of the semiconductor light emitting device 110 is 200 µm.

The length $w_{na}$ in the X direction of the first region A is 10 µm.

The length $w_{d1}$ in the X direction of one region out of the second regions B provided on both sides of the first region A is 5 µm. That is, the total length ($2w_{d1}$) in the X direction of the second regions B is 10 µm.

The length $w_{nb}$ in the X direction of the first electrode 41 and the length ($W-2w_{d1}-2W_{d2}w_{na}$) in the X direction of the fourth region D are variables.

As shown in FIG. 5A, as the ratio $w_{na}/w_{nb}$ decreases (i.e. the length $w_{d2}$ of one region out of the second regions B increases), the resistance r of the first electrode 41 significantly decreases, the light extraction efficiency LE decreases, and the current density J increases. This is because the area of the fourth region D having a high reflectance decreases as the length $w_{d2}$ increases.

In particular, the current density J in $w_{na}/w_{nb}<0.1$ is larger than the value of twice the current density J when $w_{na}/w_{nb}=1$. In the case where the density J of current injected into the light emitting layer 30 of the semiconductor light emitting device 110 is high, the heat generation amount per unit area in the contact portion 51 is increased, and thermal degradation is likely to occur. Furthermore, since the internal quantum efficiency is reduced by the efficiency droop phenomenon, the light output is reduced.

Therefore, the ratio $w_{na}/w_{nb}$ is preferably not less than 0.1 and not more than 1.

As shown in FIG. 5B, as the ratio $l_{na}/w_{nb}$ decreases (i.e. the length $w_{nb}$ in the X direction of the first electrode 41 increases), a similar tendency to FIG. 5A is seen.

In particular, the current density J in $l_{na}/w_{nb}<3$ is larger than the value of twice the current density J when $l_{na}/w_{nb}=30$.

Therefore, the ratio $l_{na}/w_{nb}$ is preferably not less than 3 and not more than 30.

Thus, the first embodiment provides a semiconductor light emitting device in which the light extraction efficiency and current spread are well balanced.

Next, a method for manufacturing a semiconductor light emitting device according to the first embodiment is described.

First, the first semiconductor layer 10, the light emitting layer 30, and the second semiconductor layer 20 containing a nitride semiconductor are sequentially formed on a substrate for growth by crystal growth. Thereby, the stacked structure body 100 is formed on the substrate for growth. A buffer layer may be formed between the substrate for growth and the first semiconductor layer 10. Si, for example, is used for the substrate for growth. The embodiment is not limited thereto, and for example, one of Si, SiO$_2$, quartz, sapphire, GaN, SiC, and GaAs is used for the substrate for growth. At this time, the plane direction of the substrate for growth is arbitrary. In the following, an example is described in which a sapphire substrate is used as the substrate for growth.

Next, the recess 100*t* is formed in part of the stacked structure body 100 by, for example, dry etching. The recess 100*t* extends from the semiconductor layer 20 side of the stacked structure body 100 to the first semiconductor layer 10. Thereby, the first semiconductor layer 10 is exposed at the bottom of the recess 100*t*. The bottom is the second surface 10*b* of the first semiconductor layer 10.

The recess 100*t* is a region for forming the second portion 41*b* and the extension portion 43 connected to the pad 42.

Next, the dielectric layer 81 having a refractive index lower than the refractive index of the first semiconductor layer 10 is formed in the recess 100*t*. Specifically, $SiO_2$ is formed with a thickness of 400 nm as the dielectric layer 81. Part of the dielectric layer 81 in the recess 100*t* is selectively removed by, for example, wet etching. For example, an opening with a length of 10 μm is formed in a bottom portion of the recess 100*t* in the dielectric layer 81. Thereby, the dielectric layer 81 (the first dielectric portion 81*a*) in contact with part of the second surface 10*b* is formed.

Next, the first electrode 41 is formed on the first semiconductor layer 10 and on the dielectric layer 81 by, for example, lift-off. Thereby, the first electrode 41 is formed that includes the first portion 41*a* in contact with a region of the second surface 10*b* not in contact with the dielectric layer 81 and the second portion 41*b* in contact with a portion of the dielectric layer 81 on the opposite side to the first semiconductor layer 10. Specifically, Ti/Pt/Au/Ti are formed in this order from the first semiconductor layer 10 side with a thickness of 700 nm. To improve the ohmic properties, sintering may be performed under the conditions of 650° C., a nitrogen atmosphere, and 1 minute. The length in the X direction of the second portion 41*b* of the first electrode 41 is, for example, 20 μm.

Next, the dielectric layer 81 (the second dielectric portion 81*b*) is further formed on the first electrode 41. Specifically, $SiO_2$ is formed with a thickness of 600 μm as the second dielectric portion 81*b*. Thereby, the second dielectric portion 81*b* of the dielectric layer 81 covering the opposite side of the first electrode 41 from the first semiconductor layer 10 is formed.

Next, part of the dielectric layer 81 remaining on the second semiconductor layer 20 is selectively removed by, for example, wet etching. Next, the contact portion 51 of the second electrode 50 is formed on the second semiconductor layer 20. Specifically, Ag is formed with a thickness of 200 nm as the second electrode 50. Sintering of 400° C., an oxygen atmosphere, and 1 minute is performed. Thereby, the contact portion 51 of the second electrode 50 in contact with a portion of the second semiconductor layer 20 on the opposite side to the light emitting layer 30 is formed.

Next, for example, a stacked film of Ti/Pt/Au is formed with a thickness of, for example, 800 nm as the bonding metal portion 52 on the opposite side of the contact portion 51 from the second semiconductor layer 20.

In parallel with these processes, the support substrate 54 of, for example, Si is prepared. The bonding layer 53 is provided on the upper surface of the support substrate 54, for example. A solder with a thickness of 3 μm, for example, is used for the bonding layer 53. The solder contains a AuSn alloy.

Next, the bonding metal portion 52 of the second electrode 50 and the bonding layer 53 are opposed to each other, and are bonded by, for example, heating at a temperature of not less than the eutectic point of the solder. Specifically, the temperature is 300° C. Thereby, the support substrate 54 is bonded to the stacked structure body 100 and is electrically connected to the second electrode 50.

Next, for example, laser light of the third harmonic (355 nm) or the fourth harmonic (266 nm) of a $YVO_4$ solid-state laser is applied through a surface of the substrate for growth on the opposite side to the stacked structure body 100. The GaN existing at the interface between the substrate for growth and the stacked structure body 100 is decomposed into Ga and N, for example. Then, the decomposed Ga is removed by hydrochloric acid treatment or the like, and the substrate for growth is removed from the stacked structure body. Thereby, the substrate for growth and the stacked structure body are separated.

Next, dry etching, for example, is performed from the opposite side of the stacked structure body 100 from the support substrate 54. Thereby, the first surface 10*a* of the first semiconductor layer 10 is exposed. At this time, the etching amount is adjusted to cause the first semiconductor layer 10 to have a thickness of 4 μm.

Next, part of the stacked structure body 100 is selectively removed by dry etching. Part of the dielectric layer 81 and part of the first electrode 41 are exposed. Thereby, the extension portion 43 of the first electrode 41 exposed on the outside of the first semiconductor layer 10 is formed.

Next, the dielectric layer 83 is selectively formed on the side surface of the stacked structure body 100, part of the first surface 10*a* of the first semiconductor layer 10, part of the dielectric layer 81 exposed in the above manner, and the extension portion 43 of the first electrode 41. Specifically, $SiO_2$ is formed with a thickness of 600 nm as the dielectric layer 83. The first surface 10*a* of the first semiconductor layer 10 is exposed from the opening of the dielectric layer 83.

Next, the dielectric layer 83 is used as a mask to etch the first surface 10*a* of the first semiconductor layer 10 using, for example, a KOH solution. Thereby, the concavities-convexities 12 are formed at the first surface 10*a*. For example, a 1 mol/L KOH solution is heated to 80° C. and etching for 20 minutes is performed.

Next, the dielectric layer 83 on the extension portion 43 of the first electrode 41 is removed by, for example, wet etching. Next, for example, Ti/Pt/Au is selectively formed with a thickness of 500 nm on the extension portion 43 of the first electrode 41. Thereby, the pad 42 is formed.

Next, a surface of the support substrate 54 on the opposite side to the stacked structure body 100 is ground to a thickness of approximately 100 μm. Ti/Pt/Au, for example, is formed with a thickness of 800 nm on the surface of the support substrate 54 on the opposite side to the stacked structure body 100. Thereby, the back surface electrode 55 is formed.

Next, the support substrate 54 is cut by, for example, cleaving, a diamond blade, etc. Thus, the semiconductor light emitting device 110 is obtained. The semiconductor light emitting device 110 may be mounted on a mounting substrate or the like.

Second Embodiment

Figure 6A:
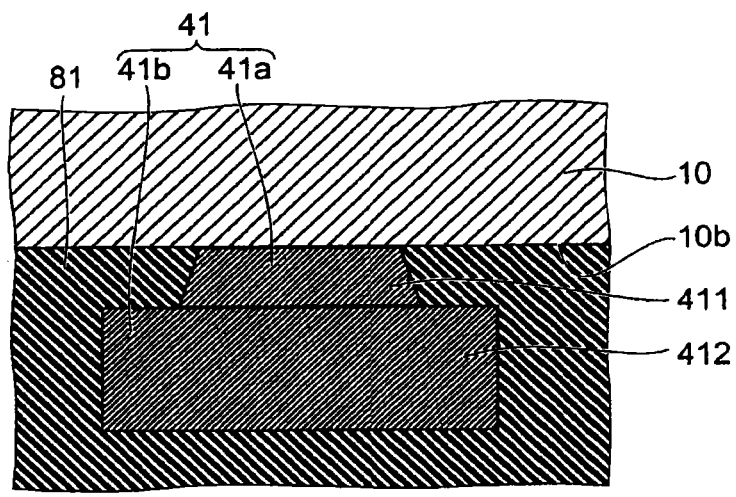
FIGS. 6A to 6C are schematic cross-sectional views showing semiconductor light emitting devices of a second embodiment.
Figure 6B:
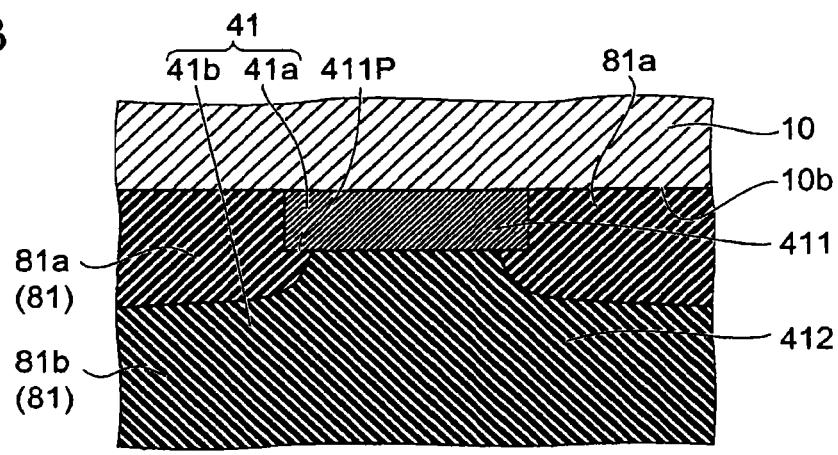
Figure 6C:
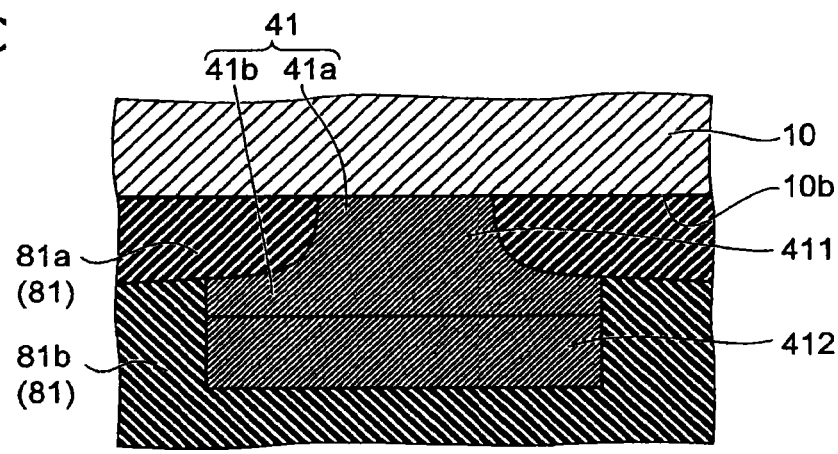

FIGS. 6A to 6C are schematic cross-sectional views showing semiconductor light emitting devices of a second embodiment.

The second embodiment differs from the first embodiment in that the first electrode 41 is a two-layer structure. Otherwise, the configuration of the second embodiment is similar to the first embodiment.

FIGS. 6A to 6C show cross-sectional views of a portion in and around the first electrode 41 of the semiconductor light emitting device. The drawings show different specific examples in the second embodiment.

Similarly to the first embodiment, the first electrode 41 includes the first portion 41*a* in contact with a region of the second surface 10*b* not in contact with the dielectric layer 81 and the second portion 41b in contact with a portion of the dielectric layer 81 on the opposite side to the first semiconductor layer 10.

FIG. 6A shows a first specific example of the second embodiment.

As shown in FIG. 6A, the first electrode 41 includes a first conductive layer 411 and a second conductive layer 412. The first conductive layer 411 includes the first portion 41a. The second conductive layer 412 includes the second portion 41b, and is in contact with the opposite side of the first conductive layer 411 from the first semiconductor layer 10. The portion where the first conductive layer 411 is in contact with the dielectric layer 81 is larger than the portion where the second conductive layer 412 is in contact with the dielectric layer 81.

Here, the first conductive layer 411 preferably contains a material that makes ohmic contact with the first semiconductor layer 10 in order to inject carriers into the first semiconductor layer 10. Specifically, the first conductive layer 411 contains Ti, Au, Al, Ag, or an alloy containing one of them, or a conductive transparent oxide (e.g. ITO).

On the other hand, the second conductive layer 412 contains a material different from the material of the first conductive layer 411. The second conductive layer 412 functions as an auxiliary interconnection for reducing the resistance of the first electrode 41. The second conductive layer 412 preferably contains a material having a lower resistivity than the first conductive layer 411. Specifically, the second conductive layer 412 contains Al, Ag, Cu, or an alloy containing one of them.

Next, a second specific example and a third specific example in the second embodiment are described. The second specific example and the third specific example described below are modification examples of the first specific example mentioned above.

FIG. 6B shows the second specific example of the second embodiment.

As shown in FIG. 6B, the first electrode 41 includes the first conductive layer 411 and the second conductive layer 412. The dielectric layer 81 may be provided in contact with a peripheral portion 411p of the first conductive layer 411 on the opposite side to the first semiconductor layer 10. The peripheral portion 411p of the first conductive layer 411 is covered with the dielectric layer 81. Thereby, it becomes difficult for the first conductive layer 411 to be peeled off from the first semiconductor layer 10. The second conductive layer 412 contains a material different from the material of the first conductive layer 411.

FIG. 6C shows the third specific example of the second embodiment.

As shown in FIG. 6C, the first conductive layer 411 may include the first portion 41a and the second portion 41b. The second conductive layer 412 is provided in a region overlapping with the first conductive layer 411 as viewed from the Z direction, and is in contact with the opposite side of the first conductive layer 411 from the first semiconductor layer 10. Also in the third specific example, the dielectric layer 81 is provided in contact with the peripheral portion 411p of the first conductive layer 411 on the opposite side to the first semiconductor layer 10. The second conductive layer 412 contains a material different from the material of the first conductive layer 411. The first conductive layer 411 and the second conductive layer 412 are patterned by one etching process, for example.

In the second embodiment, the first electrode 41 includes the first conductive layer 411 serving to inject carriers and the second conductive layer 412 functioning as an auxiliary interconnection. In view of this, optimum materials may be selected in accordance with the respective roles of the first conductive layer 411 and the second conductive layer 412.

Third Embodiment

Figure 7:
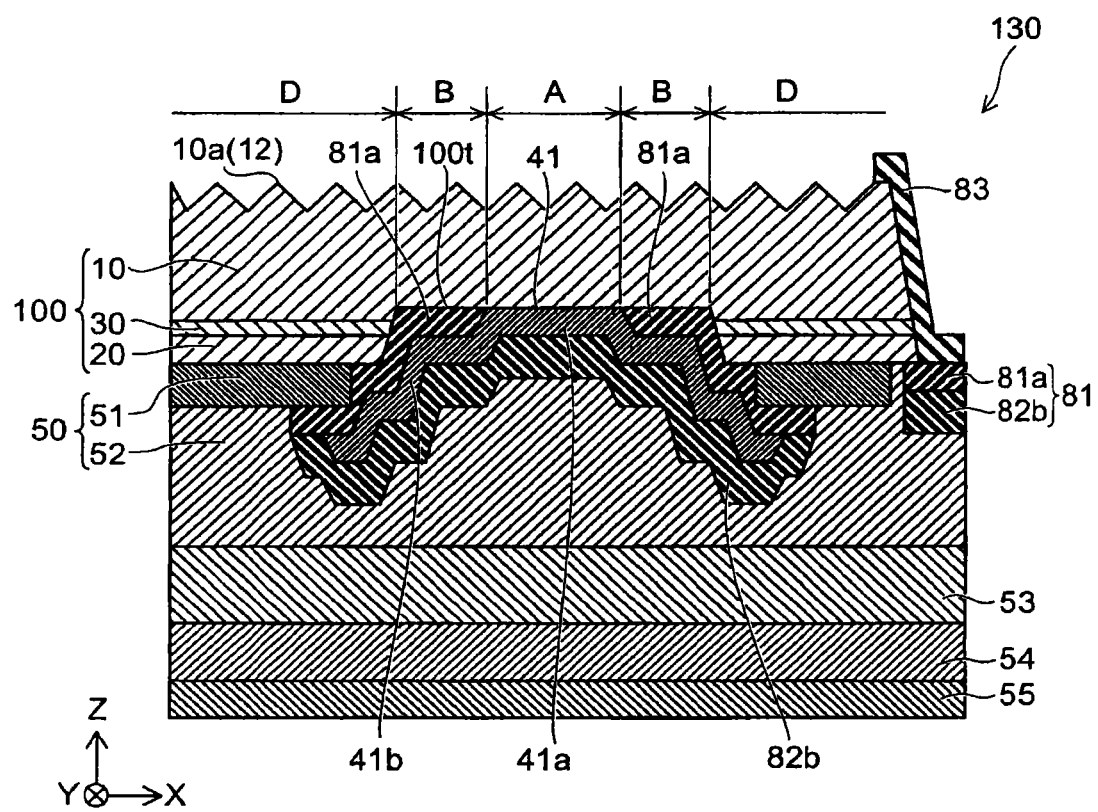
FIG. 7 is a schematic cross-sectional view of a third embodiment.

FIG. 7 is a schematic cross-sectional view of a third embodiment.

The third embodiment differs from the first embodiment in that the first electrode 41 is stranded on the support substrate 54 side of the second electrode 50. Otherwise, the configuration of the third embodiment is similar to the first embodiment.

As shown in FIG. 7, the dielectric layer 81 is provided in contact with a portion of the contact portion 51 of the second electrode 50 on the opposite side to the second semiconductor layer 20. The dielectric layer 81 is in contact with part of the second surface 10b of the first semiconductor layer 10, the side surface and the surface on the support substrate 54 side of the stacked structure body 100, and the peripheral portion of the second electrode 50.

The second portion 41b of the first electrode 41 is provided up to a position overlapping with the second electrode 50 as viewed from the Z direction. The second portion 41b overlaps also with part of the light emitting layer 30 and part of the second semiconductor layer 20 as viewed from the Z direction. In this case, as viewed from the Z direction, the whole of the bonding metal portion 52 of the second electrode 50 overlaps with the second portion 41b of the first electrode 41 or the contact portion 51 of the second electrode 50. In other words, the bonding metal portion 52 is concealed from the first surface 10a.

In the third embodiment, the material of at least a portion of the first electrode 41 on the side in contact with the second surface 10b preferably contains a material having a higher light reflectance than the bonding metal portion 52, out of the materials that make ohmic contact with the first semiconductor layer 10. By the arrangement mentioned above, the emitted light that has entered the dielectric layer 81 from the light emitting layer 30 is reflected by the second portion 41b of the first electrode 41 without reaching the bonding metal portion 52. Thereby, the light extraction efficiency is improved.

The material of at least a portion of the first electrode 41 on the side in contact with the second surface is, for example, Al. The material of a portion of the bonding metal portion 52 on the second semiconductor layer 20 side is Ti. Specifically, the first electrode 41 is, for example, Al/Ni/Au/Ti from the first semiconductor layer 10 side. The first electrode 41 has a thickness of, for example, 800 nm.

In the third embodiment, the second portion 41b of the first electrode 41 is provided to the support substrate 54 side of the contact portion 51 of the second electrode 50. Thereby, the area of the first electrode 41 is expanded, and the resistance of the first electrode 41 can be arbitrarily reduced.

It is also possible to reduce the resistance of the first electrode 41 and shorten the length in the X direction of the recess 100t. In other words, the area where the first electrode 41 and the dielectric layer 81 are in contact with the first semiconductor layer 10 can be reduced. Thereby, the area of the contact portion 51 of the second electrode 50 can be enlarged. As described above, the resistivity of the second semiconductor layer 20 of the p type is higher than the resistivity of the first semiconductor layer 10 of the n type. Therefore, since the area of the contact portion 51 of the second electrode 50 is large, the light emitting region can be enlarged. Furthermore, since the current density can be reduced, the light emitting efficiency is improved and the operating voltage is reduced.

The method for manufacturing a semiconductor light emitting device according to the third embodiment is similar to that of the first embodiment except that the contact portion 51 of the second electrode 50 is formed before the first electrode 41 is formed.

As described above, a semiconductor light emitting device with a high light emission efficiency can be provided.

Hereinabove, embodiments and modification examples thereof are described, but the invention is not limited to these examples.

For example, as the method for forming the stacked structure body 100, in addition to the metal organic chemical vapor deposition method, other technologies such as the molecular beam epitaxial growth method may be used.

Furthermore, it is not necessary for the entire support substrate 54 to have electrical conductivity, and also a configuration is possible in which an electrical conductor such as a metal interconnection is formed on the surface of an insulative matrix of a resin or the like.

The light emission wavelength of the quantum well layer is not limited to the above. In the case where, for example, a gallium nitride-based compound semiconductor of GaInN is used for the quantum well layer, light emission of 370 nm to 700 nm is obtained.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor light emitting device comprising:
a body;
a first semiconductor layer of a first conductivity type, the first semiconductor layer being apart from the body in a first direction, the first semiconductor layer including a first part region, a second part region, and a third part region, the third part region being arranged with the first part region in a second direction crossing the first direction, the second part region being disposed between the first part region and the third part region;
a second semiconductor layer of a second conductivity type, the second semiconductor layer being provided between the body and the third part region;
a light emitting layer provided between the third part region and the second semiconductor layer;
a dielectric layer having a refractive index lower than a refractive index of the first semiconductor layer, the dielectric layer including a first dielectric portion being provided between the body and the second part region;
a second electrode between the second semiconductor layer and a part of the body, the second electrode being electrically connected with the body;
a first electrode including a first portion and a second portion, the first portion being provided between the first part region and the body, the first portion being in contact with the first part region, the second portion being provided between the first dielectric portion and the body.

2. The device according to claim 1, wherein
the first portion has a first length in a third direction crossing the first direction and being perpendicular to the second direction,
the first portion having a second length in the second direction,
the first portion extends in the third direction, and
the first length is longer than the second length.

3. The device according to claim 2, wherein
the second electrode has a contact portion in contact with the second semiconductor layer,
the contact portion has a third length in the second direction, and
the second length is shorter than the third length.

4. The device according to claim 1, wherein
the second electrode has a contact portion in contact with the second semiconductor layer, and
an area of the contact portion is larger than an area of the first electrode.

5. The device according to claim 1, further comprising
a pad,
the first electrode including an extension portion not overlapping the first semiconductor layer in the first direction, and
at least a part of the pad being arranged with the first semiconductor layer in a direction perpendicular to the first direction, the pad being in contact with the extension portion.

6. The device according to claim 5, wherein
the first portion has a first length in a third direction crossing the first direction and being perpendicular to the second direction,
the first portion having a second length in the second direction,
the first portion extends from the pad side in the third direction, and
a length in the second direction of the pad is longer than a length in the second direction of the first electrode.

7. The device according to claim 1, wherein the dielectric layer further includes a second dielectric portion,
a part of the second dielectric portion is provided between the body and the first portion,
another part of the second dielectric portion being provided between the body and the second portion.

8. The device according to claim 1, wherein the first electrode includes
a first conductive layer including the first portion; and
a second conductive layer including the second portion,
the first conductive layer is provided between the second conductive layer and the first semiconductor layer, and
the second conductive layer contains a material different from a material included in the first conductive layer.

9. The device according to claim 8, wherein at least a part of a peripheral portion of the first conductive layer is provided between the dielectric layer and the first semiconductor layer.

10. The device according to claim 1, wherein the first electrode includes
a first conductive layer including the first portion and the second portion; and
a second conductive layer,
the first conductive layer is provided between the second conductive layer and the first semiconductor layer, and
the second conductive layer contains a material different from a material included in the first conductive layer.

11. The device according to claim 1, wherein
the second electrode includes
a contact portion in contact with the second semiconductor layer, and
a metal portion,
the contact portion is provided between the metal portion and the second semiconductor layer, the metal portion is in contact with the body, and
the metal portion overlaps the first electrode in the first direction.

12. The device according to claim 1, wherein
the first semiconductor layer has a first surface and a second surface on an opposite side to the first surface,
the first electrode is in contact with the second surface,
the first semiconductor layer has concavities-convexities provided at the first surface, the concavities-convexities are provided with a pitch not less than a peak wavelength of emitted light emitted from the light emitting layer.

13. The device according to claim 1, wherein
the first conductivity type is an n type, and
the second conductivity type is a p type.

14. The device according to claim 1, wherein a material of at least a portion of the second electrode contains Ag, the portion of the second electrode is in contact with the second semiconductor layer.

15. The device according to claim 1, wherein a material of at least a portion of the first electrode contains at least one of a metal, an alloy, and ITO,
the metal includes one selected from a group consisting of Ti, Au, Al, and Ag,
the alloy includes one selected from a group consisting of Ti, Au, Al, and Ag, and
the portion of the first electrode is in contact with the second surface.

16. The device according to claim 1, wherein the dielectric layer contains at least one of $SiO_2$, SiN, and SiON.

17. The device according to claim 1, wherein
the first semiconductor layer includes a first GaN, and
the second semiconductor layer includes a second GaN.

18. The device according to claim 1, wherein a distance between the first electrode and the second semiconductor layer is longer than the thickness of the dielectric layer.

* * * * *